United States Patent [19]
Reele

[11] Patent Number: 5,438,581
[45] Date of Patent: Aug. 1, 1995

[54] LASER DRIVER ASIC CHIP

[75] Inventor: Samuel Reele, Rochester, N.Y.

[73] Assignee: Eastman Kodak Company, Rochester, N.Y.

[21] Appl. No.: 291,253

[22] Filed: Aug. 16, 1994

[51] Int. Cl.$^6$ .................................... H01S 3/00
[52] U.S. Cl. ........................................ 372/38
[58] Field of Search ...................... 372/38, 29, 24

[56] References Cited

U.S. PATENT DOCUMENTS

| 4,819,241 | 4/1989 | Nagano | 372/38 |
| 5,097,473 | 3/1992 | Taguchi | 372/38 |

Primary Examiner—Léon Scott, Jr.
Attorney, Agent, or Firm—Edward Dugas

[57] ABSTRACT

Improved rise and fall times for the driving pulses used to drive the laser in a laser writer are achieved by incorporating the sources of the READ, WRITE, and BOOST pulses in one ASIC chip and by having the pulses driving only one laser current driver stage which is held on by a READ signal, but which can be turned on harder when a WRITE and/or BOOST signal is applied, thus the delay associated with turning on the laser current driver stage is eliminated permitting higher writing speeds.

8 Claims, 9 Drawing Sheets

LASER DRIVER ASIC CHIP

CROSS-REFERENCE TO RELATED APPLICATIONS

The subject matter of the present application is related to U.S. patent application Ser. No. 234,446, entitled, "Integrated Laser Module", bearing Kodak Docket No. 69,154, filed on Apr. 28, 1994.

FIELD OF INVENTION

The present invention relates to the field of laser driver circuits and more specifically to a monolithic integrated circuit (ASIC) for driving a laser.

BACKGROUND OF THE INVENTION

The art of laser writers continually places demands on the speed at which the rise and fall times of driving pulses can be generated by a laser driver for activating a laser beam, either for reading or for writing a recording mark on a storage device, such as a CD. The second demand that the writer imposes on a laser driver is that very fast synchronized READ, WRITE, and BOOST current pulses need to be generated. Prior art laser drivers do not incorporate sources of READ, WRITE, and BOOST current pulses in one ASIC chip to supply an output driver stage. More specifically, prior art laser drivers do not have a single output driver stage driven by multiple reference currents and associated logic inputs. Therefore, prior art laser drivers have undesirable delay times between BOOST→WRITE and WRITE→READ pulses. Additionally, when there is more than one output driver stage to be turned "on", there is an inherent delay and a longer rise time to turn a separate output driver stage "on" than would be experienced by turning an active ("already on") driver "on" harder.

Also, since it is important to quiet the laser, particularly at higher speeds, it is desirable to maximize the amplitude of the high frequency injection signal (HFI) that is delivered to the laser. The HFI signal is used to quiet the laser and prevent mode hopping. Traditionally, the HFI logic and its associated oscillating transistor were not part of the laser driver. Hence, prior art systems suffered from a diminishment in the amplitude of the HFI signal because of the distance that the signal had to pass before reaching the laser. This in turn provided a less than efficient reduction in laser noise. Traditionally, HFI circuits are derived from a Colpitt's circuit which has the characteristic of changing the amplitude of its output signal when the oscillator frequency is changed, and visa versa. Also, prior art oscillators are inherently sensitive to passive substrate parasitics. It is therefore the intent of the present invention to minimize and/or to eliminate the aforementioned problems.

SUMMARY OF THE INVENTION

One arrangement of a laser driver comprises:
current driver means for providing a single driving current to a laser as a function of driving signals;
means for providing a first driving signal to said current driver means for causing a driving current to be forwarded to the laser to generate a laser READ output;
means for providing a second driving signal to said current driver means for causing an increased driving current to be forwarded to the laser to generate a laser WRITE output; and
means for providing a third driving signal to said current driver means for causing a boost in the increased driving current to be forwarded to the laser during a WRITE operation.

A method for quickly driving a laser as operating modes are shifted between READ, WRITE, and BOOST, comprises the steps of:
providing an enabling signal whenever a READ or a WRITE operation is to be performed;
summing a READ signal with a WRITE signal to drive a laser driver current source with an amplified sum signal during the writing of a recording medium;
adding a BOOST signal with the summed READ and WRITE signal during a portion of the WRITE signal to provide an improved writing of the recording medium when a WRITE data signal is high; and
deleting the WRITE signal and the BOOST signal from the READ signal when the WRITE data signal is low.

From the foregoing, it can be seen that it is a primary object of the present invention to provide a laser driver capable of increased writing speeds, and of producing higher quality "write" marks.

It is another object of the present invention to provide laser driving circuitry having improved current pulse rise and fall times.

Yet another object of the present invention is to provide a laser driver ASIC chip with the current pulse forming circuit and the driving current generation circuitry being on the same chip.

Another object of the present invention is the provision of a laser driver ASIC chip utilizing a single laser current driver that is driven by READ, WRITE and BOOST pulse sources and associated logic.

Still another object of the present invention is to integrate an HFI oscillator transistor and associated bias, pulse control logic circuitry.

The above and other objects of the present invention will become more apparent when taken in conjunction with the following description and drawings wherein like characters indicate like parts and which drawings form a part of the present invention.

DETAILED DESCRIPTION OF THE INVENTION

Figure 1:
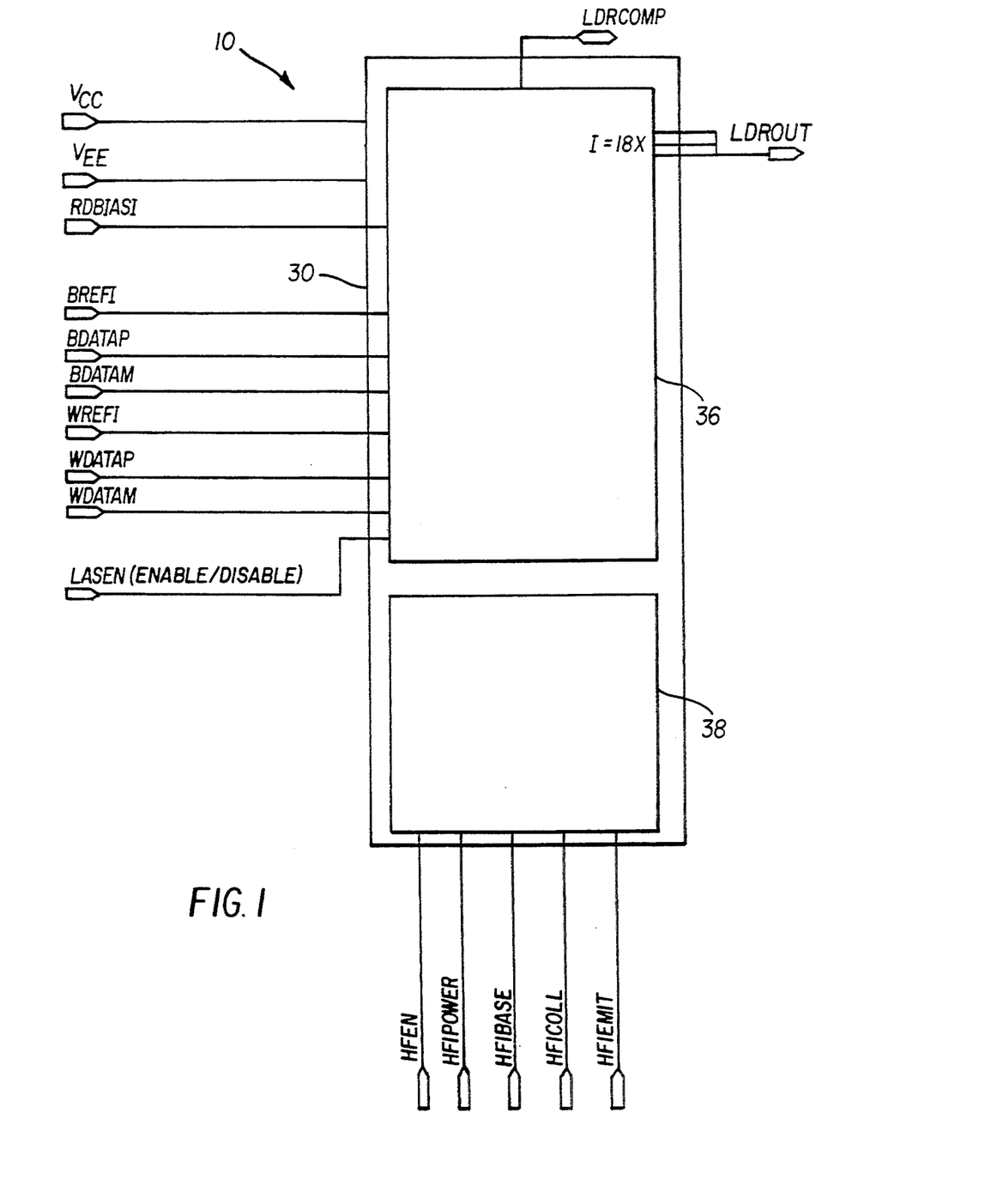
FIG. 1 is a representative top view of the laser driver ASIC with associated pin notations.

Referring to FIG. 1, the ASIC (Application Specific Integrated Circuit) 10, for driving a laser, which may be a common cathode laser, is formed with a laser driver circuit and it's associated logic circuitry, generally denoted by the block labeled 36 along with an integrated portion of an HFI circuit and associated logic circuitry, generally denoted by the block labeled 38, all of which are integrated into a silicon chip 30. The functions associated with each of the labeled Pin/Pads are set forth in Appendix A.

Figure 2:
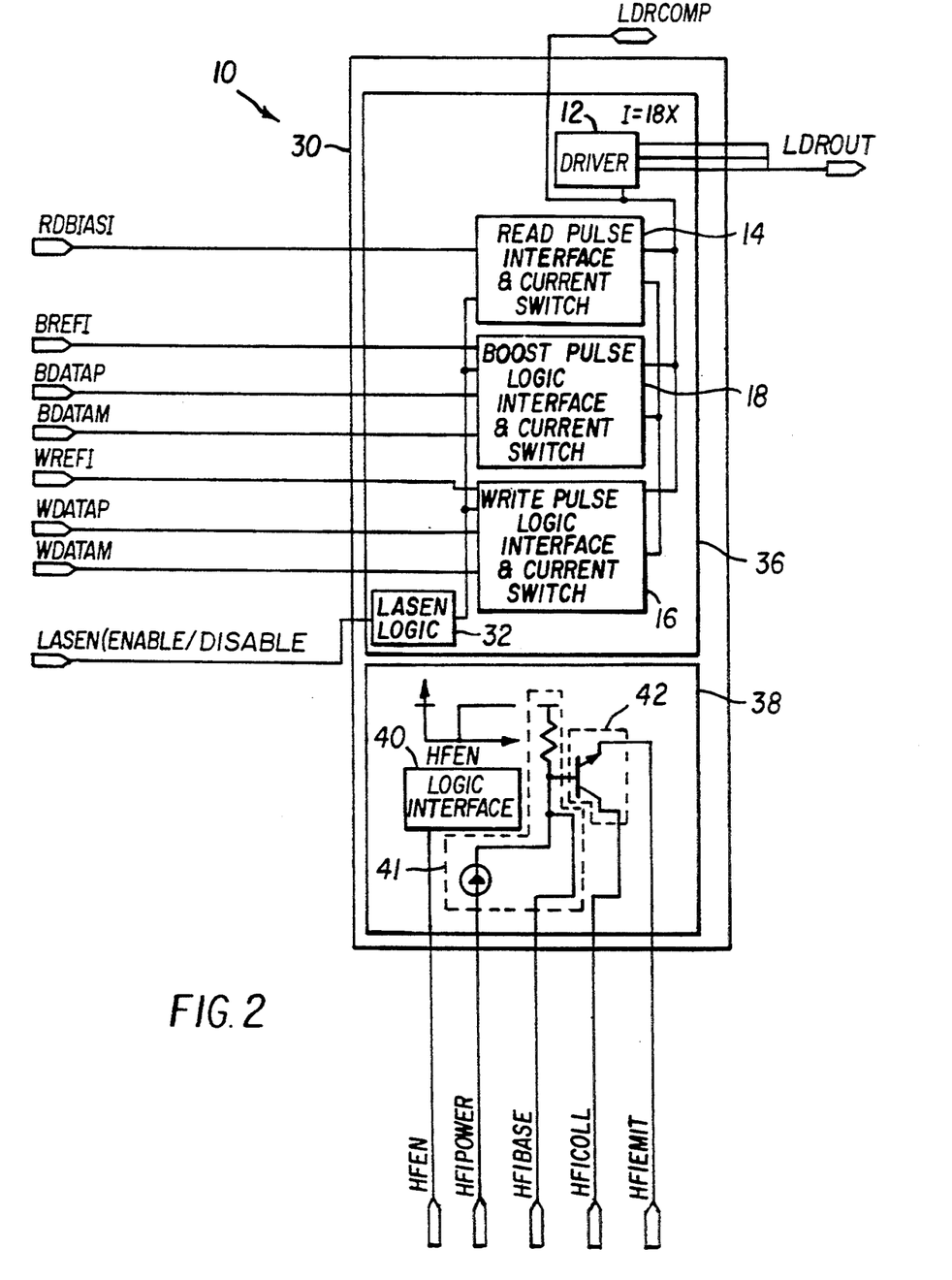
FIG. 2 illustrates in block diagram form the logic and HFI circuitry located within the laser driver ASIC of FIG. 1.

Referring to FIG. 2, the laser driver and associated logic circuit 36 is represented by functional blocks. Specifically, the laser driver is constructed with a read pulse interface and current switch block 14, write and boost pulse logic interface and current switch blocks 16 and 18, respectively, and a LASEN logic block 32. The HFI circuit and associated logic block 38 is represented by a logic interface block 40, bias circuit 41, and an HFI oscillator transistor 42 and associated bias circuitry shown in simplified form. The frequency of the injection current generated by the HFI circuit is approximately 500 MHz.

Figure 3A:
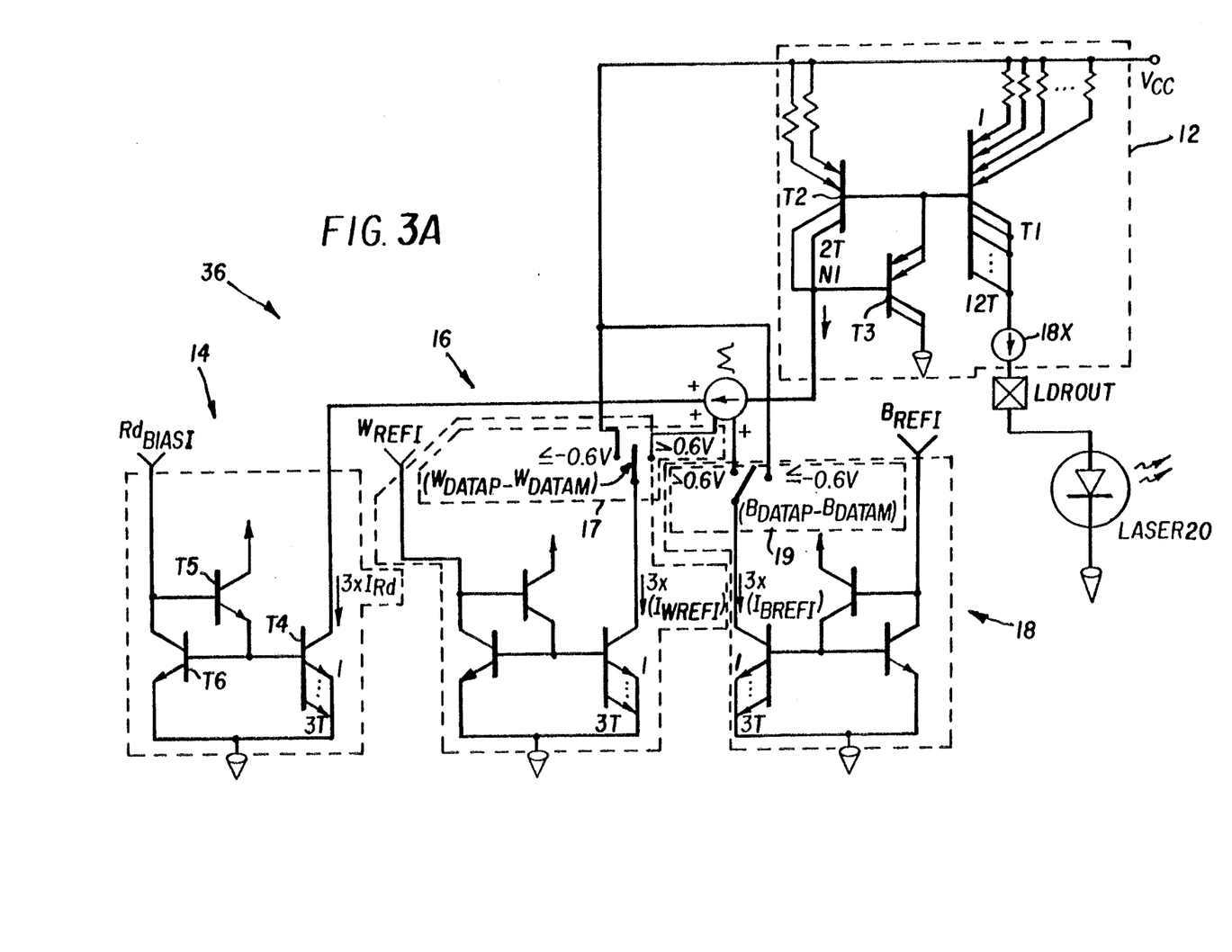
FIGS. 3A and 3B are simplified schematic representations illustrating circuit arrangements for the laser driver portion of the ASIC.

Referring now to FIG. 3A, the laser driver and associated logic circuit 36 has a single output driver circuit 12 composed of a PNP current source that is capable of providing a current of 430 ma maximum to the anode of a laser 20. The PNP current source contains three PNP transistors: T1, T2, and T3. The gain of this output driver circuit 12 is 6 X. This means that any current sunk from the node N1 of T2's collector and T3's base is multiplied by six and converted to a current source for the anode of laser 20. The gain of 6 X is derived from the composition of T1 being twelve PNP transistors in parallel and the composition of T2 being two identical PNP transistors in parallel. Thus, the gain is derived from the number of transistors forming T1 (twelve) divided by the number of transistors forming T2 (two) to equal a gain of 6 X.

By design in order to ensure minimum propagation delays between READ, WRITE, and BOOST pulses (specifically WRITE→READ or BOOST→WRITE) and to ensure minimum rise and fall times for WRITE and BOOST pulses; the node N1 is driven by the summation of three current sinks. The three current sinks are individual NPN current mirrors making up the blocks labeled 14, 16, and 18.

The current mirror in block 14 contains three NPN transistors: T4, T5, and T6. The gain of this current mirror 14 is 3 X. This means that any current sourced into the node at T6's collector and T5's base is multiplied by three and converted to a current sink to be summed at node N1. The gain of 3 X is derived from the composition of T4 being three NPN transistors in parallel and the composition of T6 being one NPN transistor. Thus the gain is derived from the number of transistors forming T4 (three) divided by the number of transistors forming T6 (one) to equal a gain of 3 X. The construction and gain of the current mirrors in blocks 16 and 18 is the same as that of the current mirror in block 14.

Figure 3B:
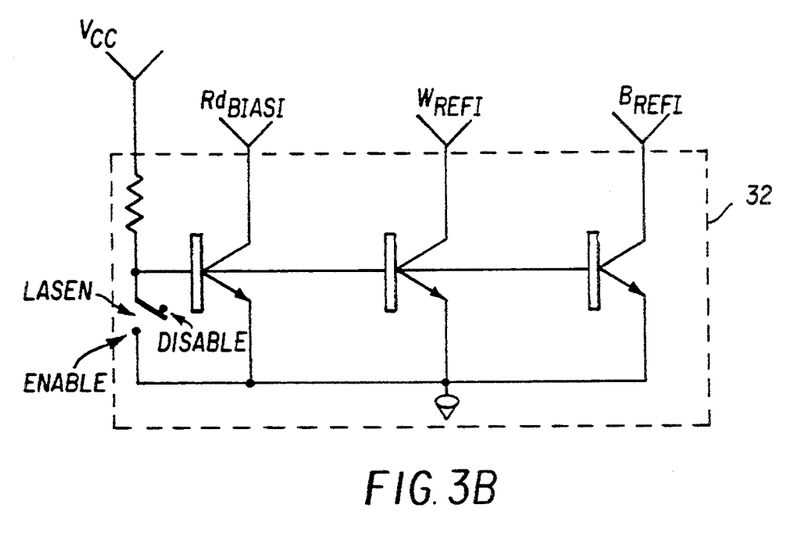

Referring to FIG. 3B, each of the current mirrors 14, 16, and 18, has its input current shunted to ground by a logic switch 32 when the laser driver chip is in the laser disable mode (LASEN=disable mode). When LASEN is in the enable mode, the logic switch 32 is disabled, thus enabling any reference or bias current to be gained up and passed to the laser 20. The collectors of the three transistors making up logic switch are each connected to the base collector junction of their labeled current mirror. For example, the collector of the transistor labeled $Rd_{BIASI}$ is connected to the base of transistor T5 and to the collector of T6.

When LASEN (see FIG. 5A) is in the enable mode, the current $Rd_{BIASI}$ is gained by a factor of three converted to a current sink by circuit 14, summed at node N1, and gained by a factor of six in the output driver circuit 12 and converted to the current source that is used to feed the laser 20. This is true whenever a $Rd_{BIASI}$ (see FIG. 5C) is available and LASEN is enabled.

When LASEN is in the enable mode and the differential WRITE data logic input signal ($W_{DATAP}$-$W_{DATAM}$) (see FIG. 5F) is greater than +0.6 V, the current $W_{REFI}$ is gained by a factor of three converted to a current sink by circuit 16, and summed at node N1 with three times the $Rd_{BIASI}$ signal (and/or three times the $B_{REFI}$ signal if present). In addition, the summed currents at node N1 are gained by a factor of six in the output driver circuit 12 and converted to a current source, LDROUT, that is used to feed the laser 20. This is true whenever $Rd_{BIASI}$ is available and LASEN is enabled. The switching arrangement surrounded by the dashed lines and labeled 17 form the logic portion of block 16. In a like manner, the switching arrangement surrounded by the dashed lines and labeled 19 form the logic portion of block 19. Continuing on, when LASEN is in the enable mode and the differential WRITE data logic input signal ($W_{DATAP}$-$W_{DATAM}$) is less than or equal to −0.6 V, the $W_{REFI}$ current is not summed at node N1, but is bypassed to $V_{CC}$. Thus, there is no contribution from the $W_{REFI}$ current to the output LDROUT of the driver circuit 12.

When LASEN is in the enable mode and the differential BOOST data logic input signal ($B_{DATAP}$-$B_{DATAM}$) (see FIG. 5G) is greater than +0.6 V, the current $B_{REFI}$ (see FIG. 5F) is gained by a factor of three, converted to a current sink by circuit 18 and summed at node N1 with three times the $Rd_{BIASI}$ signal and/or three times the $W_{REFI}$ signal, if present, and gained by a factor of six in the output driver circuit 12 and feed to the laser 20. This is true whenever $Rd_{BIASI}$ and $B_{REFI}$ are available with associated positive boost logic, and LASEN is enabled. Conversely, when LASEN is in the enable mode and the differential BOOST data logic input signal ($B_{DATAP}$-$B_{DATAM}$) is less than or equal to −0.6 V, the current $B_{REFI}$ is not summed at node N1, but is bypassed to $V_{CC}$. Thus, there is no contribution from the current $B_{REFI}$ to the output LDROUT (see FIG. 5I).

In conclusion, the total current feeding the laser 20 is equal to 18 X ($Rd_{BIASI}$+$W_{REFI}$+$B_{REFI}$) when the LASEN is enabled and the differential WRITE data logic input signal and the differential BOOST data logic input signal are greater than +0.6 V. The level of differences +0.6 V and −0.6 V is determined by the level assigned to a binary 1, Logic (Hi), and a binary 0, Logic (Lo), and whether a 1 or a 0 is to be formed with a WRITE pulse.

It is now apparent that there are a number of advantages to the aforementioned architecture of the laser driver. Propagation delays are minimized and signal rise and fall times are minimized. Specifically, the propagation delay from write to read and from boost to write modes is virtually zero due to the fact that the output driver stage 12 is effectively "on", but turned "on" harder during the write and the boost modes versus having to wait to turn "on" separate driver stages for the write or boost modes.

Figure 4:
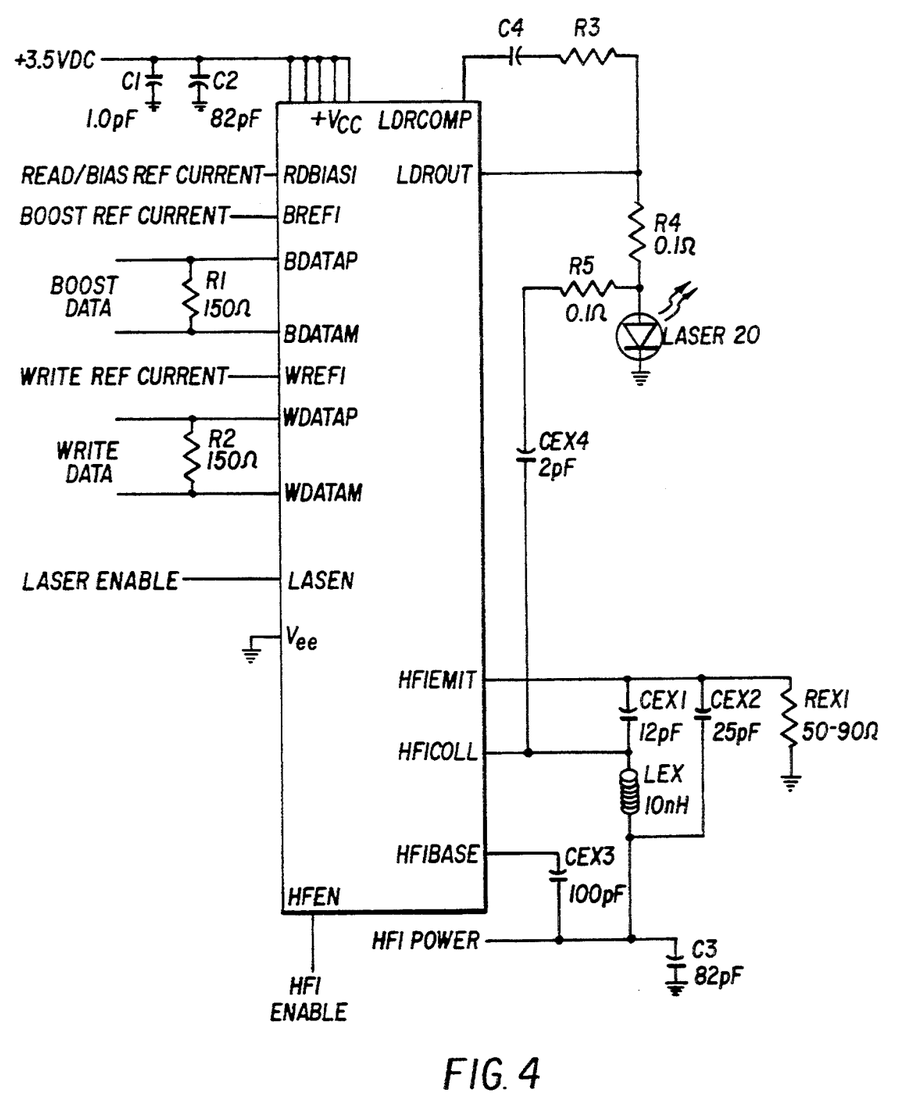
FIG. 4 illustrates the utilization of the laser driver chip of FIG. 2 with external circuitry for supporting the chip in a read/write/boost system in which the WRITE pulse can be augmented with additional current boost during part of the WRITE pulse.
Figure 5A:
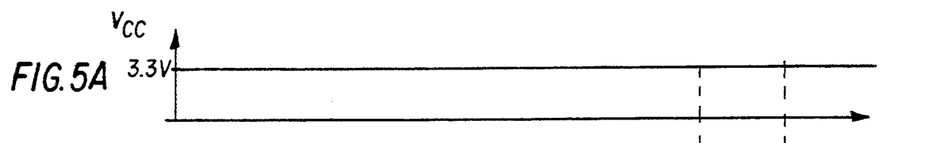
FIG. 5 is a timing diagram illustrating the operation of the laser driver chip.
Figure 5B:
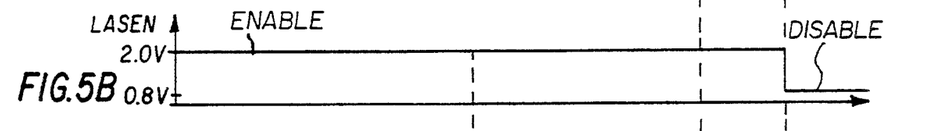
Figure 5C:
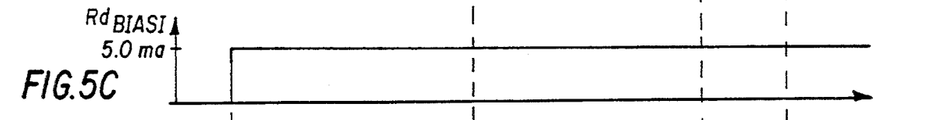
Figure 5D:
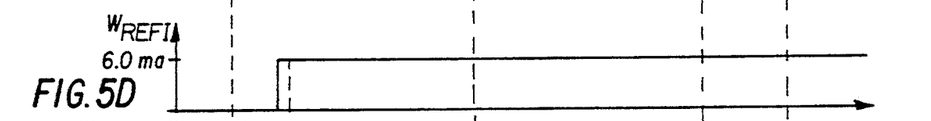
Figure 5E:
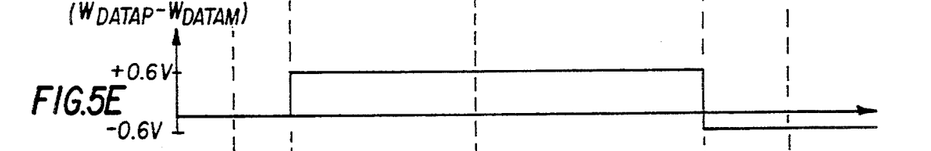
Figure 5F:
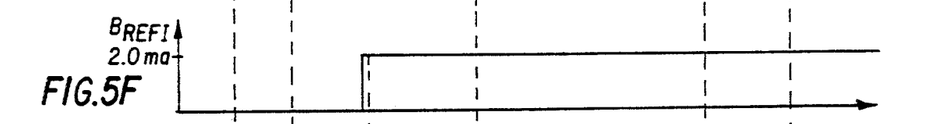
Figure 5G:
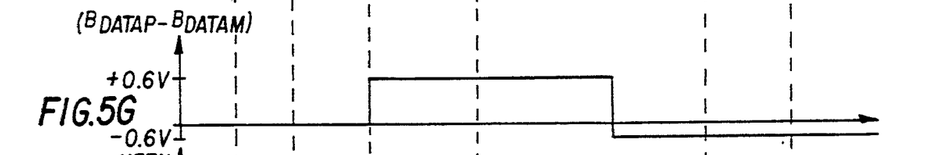
Figure 5H:
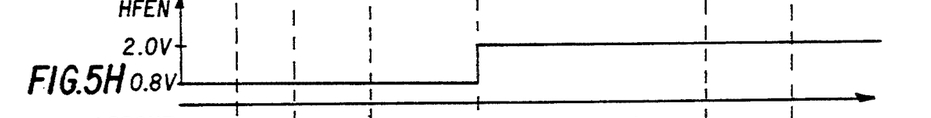
Figure 5I:
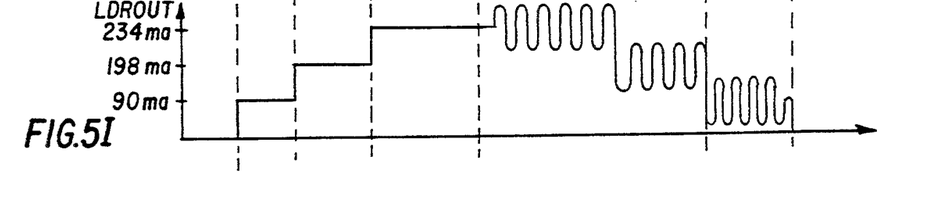
Figures 6A, 6B:
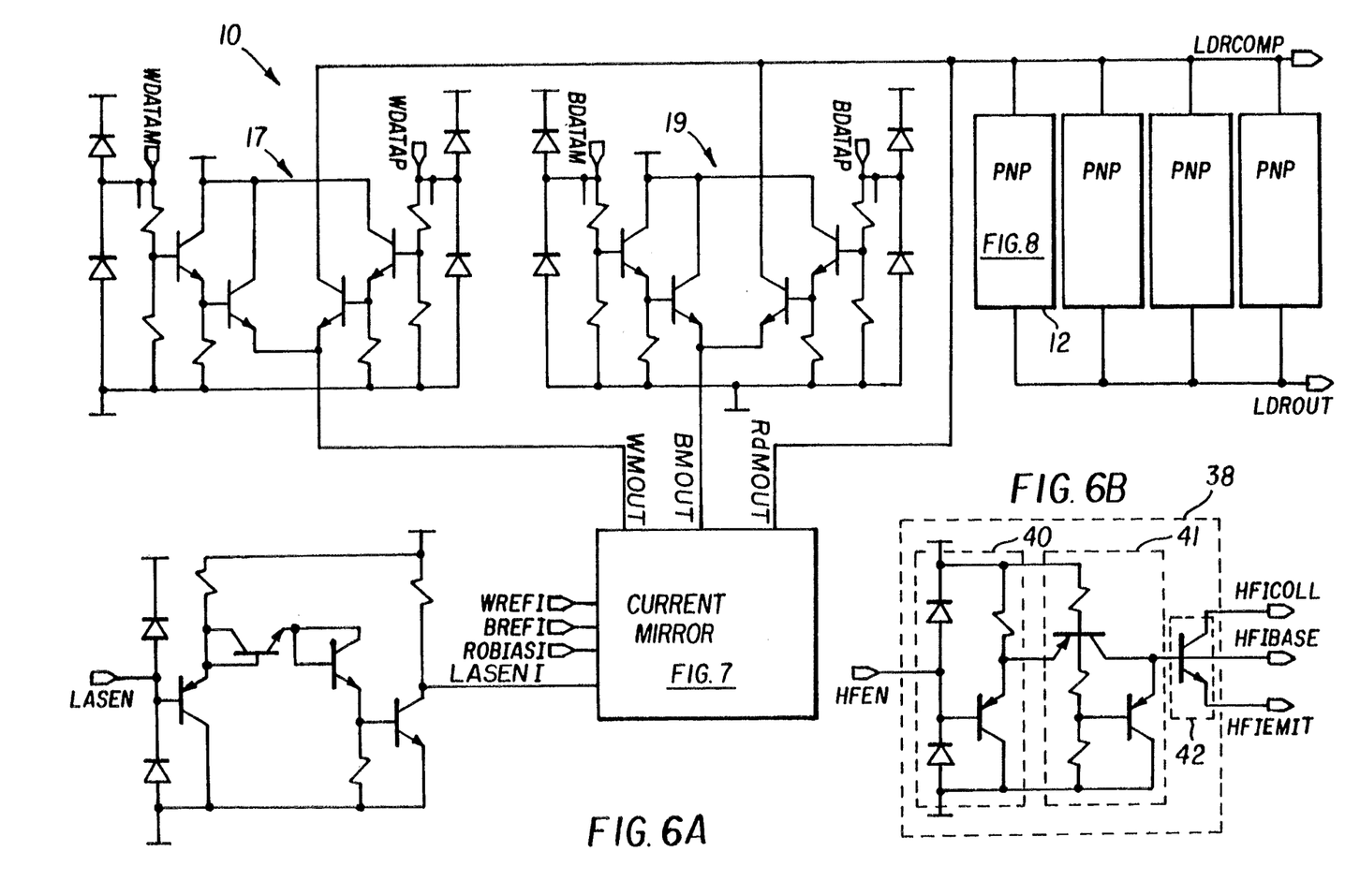
FIG. 6A is a schematic diagram of a laser drive driver circuit and its associated logic circuitry.
FIG. 6B is a schematic diagram of the HFI circuit and associated logic circuitry.
Figure 7:
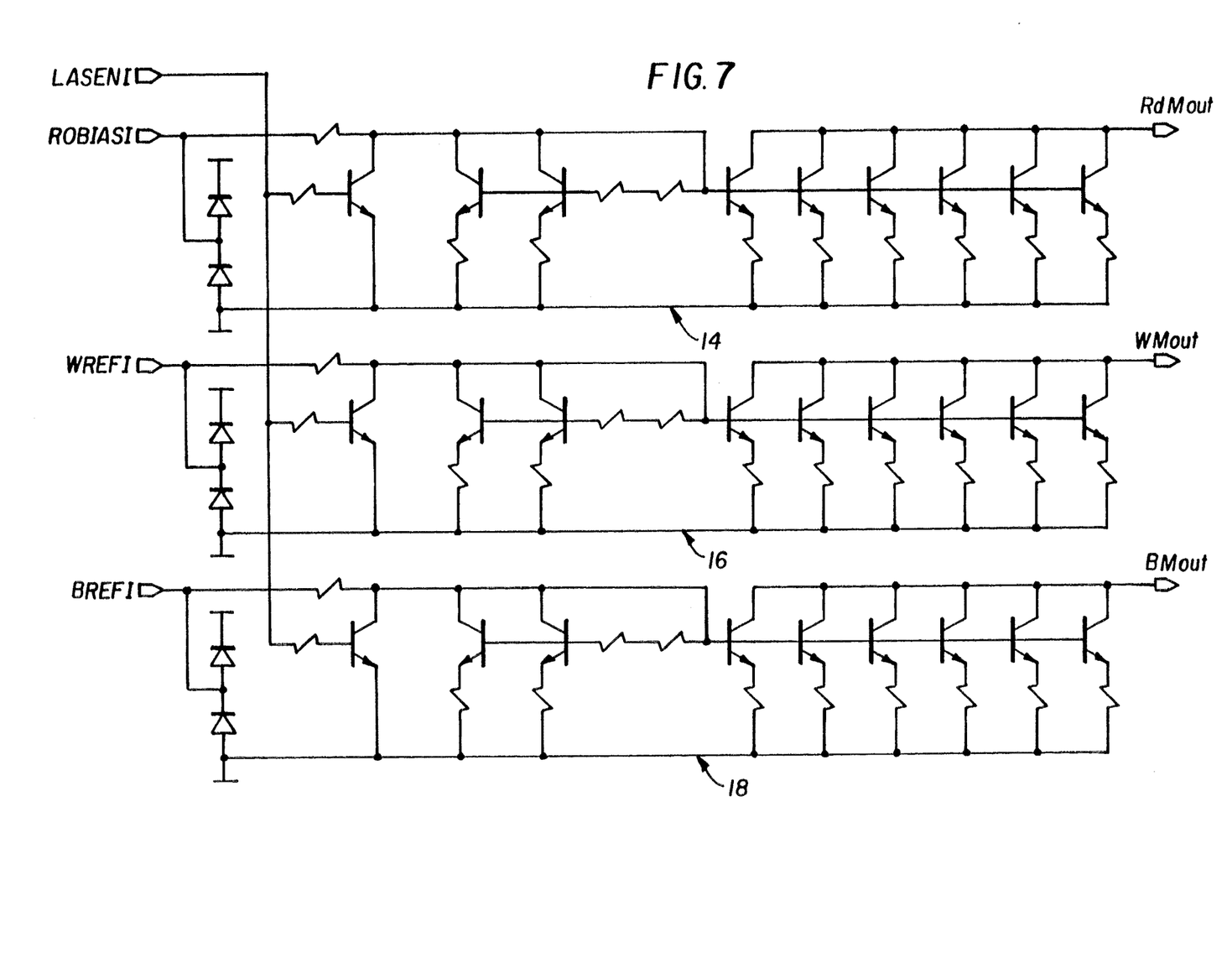
FIG. 7 is a transistor level diagram of the reference current mirror block of FIG. 6.
Figure 8:
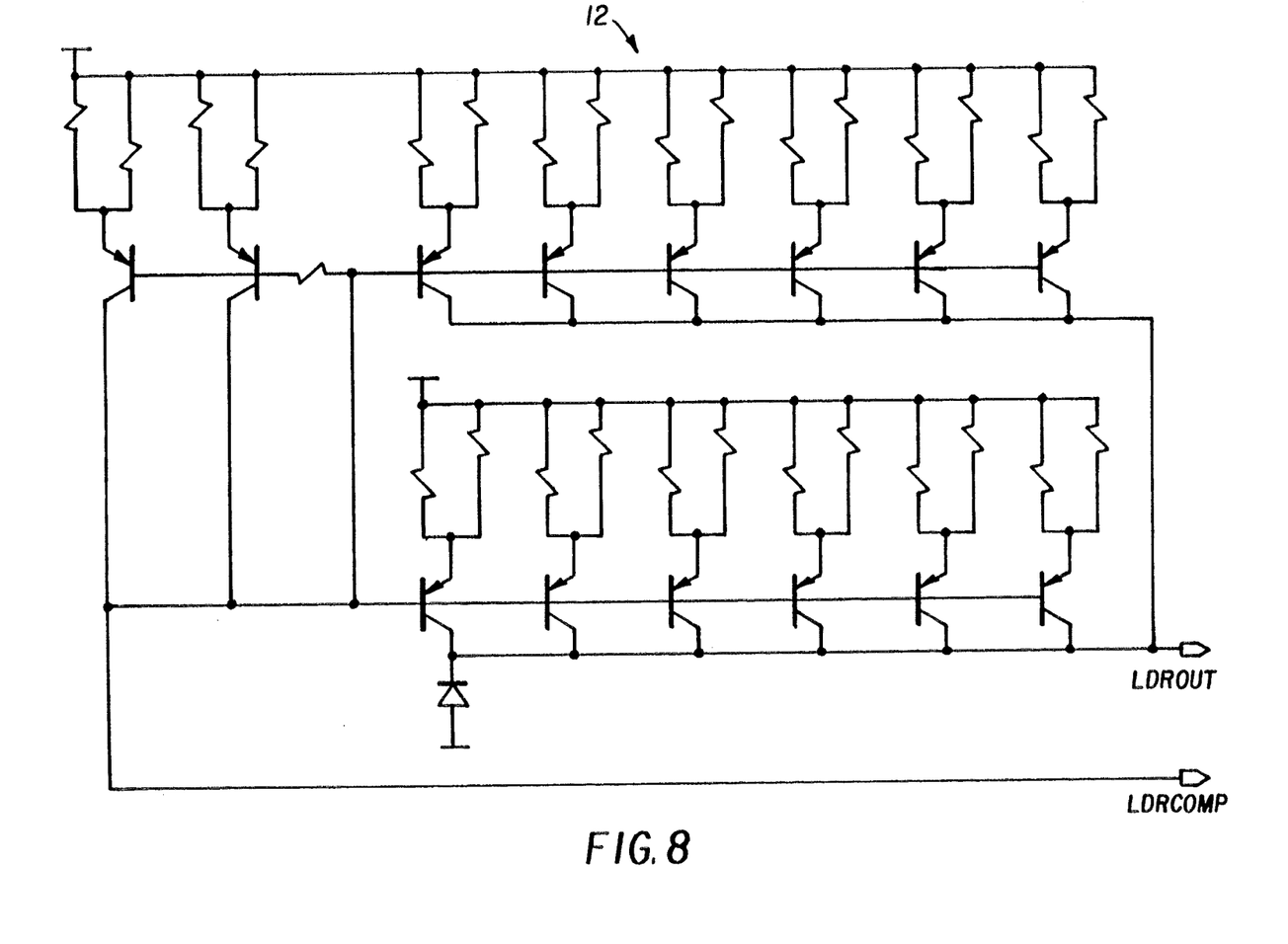
FIG. 8 is a transistor level diagram of the PNP output driver of FIG. 6.

Referring to FIG. 4, a compensation pin LDRCOMP is provided for the laser driver to which a compensation network, R3CR, from the output LDROUT can be attached. The component values of the compensation network are selected to allow the circuit designer to control the transient response of the driver in order to obtain various degrees of damping quality for different lasers. In addition, a logic input signal HFEN is provided for enabling or disabling the HFI oscillator 38. When HFEN=logic (HI), the HFI oscillator is enabled. Conversely, when HFEN=logic (LO), the HFI oscillator is disabled (see Appendix A for logic levels). Under normal system operation HFEN=Logic (HI) during READ, BOOST and WRITE. HFEN=logic (LO) for test purposes only (see FIG. 5H). HFIPWR is the positive support pin for the HFI oscillator 38. The HFI oscillator circuit is partitioned as follows: the oscillating transistor and it's associated bias circuitry are integrated internal to the laser driver ASIC chip (see FIGS. 2 and 6B) and the associated tank circuit is located externally (see FIG. 4). A detailed description of the HFI circuit is contained in U.S. patent application Ser. No. 234,446, entitled, "Integrated Laser Module", bearing Kodak Docket No. 69,154, and filed on Apr. 28, 1994.

In general, components shown external to the ASIC allow for greater flexibility in matching the ASIC to a particular application and/or are difficult to provide within the ASIC process. C1 and C2 provide customary power supply bypassing for pulse currents and harmonics. C3 provides power supply bypassing of RF current when the HFI is energized. The series combination of C4 and R3 is a transient compensation network whose exact values may be adjusted depending on the circuit layout and the allowable overshoot in the output current pulses.

R1 and R2 may be chosen to match the data transmission line coming to the ASIC, 150 ohms being typical for ribbon cable. The HFI oscillator is nominally designed to provide 475 MHz, 40 ma p-p of high frequency injection to the laser to minimize laser noise due to mode hopping. The HFI oscillator is designed to enable the user to modify power into the laser by modifying the value of CEX4. In addition, the frequency of oscillation can be modified by varying the values of LEX and the values of CEX1, CEX2 and CEX4, respectively.

If the HF injection is activated at about 500 MHz, to quiet the read laser, then NPO dielectric capacitors of about 82 to 100 pf will work well for high frequency bypassing of the power supply lines at C2 and C3. This capacitance value will have its self-resonant frequency attenuation notch near 500 MHz thus providing the maximum bypassing of unwanted EMI from the power supply lines.

FIG. 5 illustrated a timing diagram that is useful in understanding the operation of the invention.

FIGS. 6A, 6B, 7, and 8 illustrate transistor level schematics of the circuits previously described.

APPENDIX A

Pin/Pad Description

Note that for this discussion, the word pin and pad will be used interchangeably.

RDBIASI (Laser Driver Bias Reference Current)

This pin accepts a programming current, up to 7 ma from a positive external source and sinks it to ground through one base emitter voltage and approximately 140 ohms in series. The current gain is approximately 18 X between the current into this pin and the output LDROUT.

BDATAM (Level Shift #2 Plus Minus Data Input)

This pin is the minus side of the pair of data inputs. Line termination is not provided by the ASIC, so external termination should be provided as specifically required by the application. These are true differential inputs which look approximately like differential line receivers for ECL logic. The dc input impedance is nominally 4500 Ω to GND.

BDATAP (Level Shift #2 Plus Pulse Data Input)

This pin is the plus side of the pair of data inputs. Line termination is not provided by the ASIC, so external termination should be provided as specifically required by the application. These are true differential inputs which look approximately like differential line receivers for ECL logic. The dc input impedance is nominally 4500 Ω to GND.

BREFI (Laser Driver PULSE Reference Current)

This pin accepts a programing current, up to 7 ma from a positive external source and sinks it to ground through one base emitter voltage and approximately 140 ohms in series. The current gain is approximately 18 X between the current into this pin and the output LDROUT.

WREFI (Level Shift #1 Bias Reference Current)

This pin accepts a programming current, up to 10 ma from a positive external source, and sinks it to ground through one base emitter voltage and approximately 100 ohms in series. The current gain is approximately 18 X between the current into this pin and the output LDROUT.

WDATAM (Level Shift #1 Minus Pulse Data Input)

This pin is the minus side of the pair of data inputs. Line termination is not provided by the ASIC so external termination should be provided as specifically required by the application. These are true differential inputs which look approximately like differential line receivers for ECL logic. The dc input impedance is nominally 4500 Ω to GND.

WDATAP (Level Shift #1 Plus Pulse Data Input)

This pin is the plus side of the pair of data inputs. Line termination is not provided by the ASIC so external termination should be provided as specifically required by the application. These are true differential inputs which look approximately like differential line receivers for ECL logic. The dc input impedance is nominally 4500 Ω to GND.

LASEN (Laser Enable)

This is a TTL or HCMOS input. When it is high, current flows into the laser. When it is low, laser current does not flow.

HFEN (Enable/HFI Power)

This pin is a logic input pin (TTL or HDMOS) which enables or disables the High Frequency oscillator drive circuit. HFEN=logic (HI=1) enables the HFI oscillator, whereas HFEN=logic (LO=0) disables the HFI oscillator circuit. HFEN=logic (HI=1) during READ, BOOST and WRITE.

HFIBASE (Base/Bias/Bypass)

This pin is the base of the integrated transistor used for the HFI oscillator. There is also an internal network to provide base bias for the transistor.

HFICOLL (Collector/Tank)

This pin is the collector for the integrated transistor used for the HFI oscillator.

HFIEMIT (Emitter/Output)

This pin is the emitter for the integrated transistor used for the HFI oscillator.

VCC

This is one of five pins for positive power. It is normally +3.4 Vdc. Multiple pins provide a lower impedance path then a single bondwire can provide.

LDROUT (Laser Driver Output)

This is one of the laser driver current output pins from which current is sourced to the common cathode laser diode load. The current available at this output pin consists of two parts: a dc component which approximately equals the indicated gain for that pin times the read bias reference current (RDBIASI) and two pulse components which approximately equals the gain for that pin times the pulse reference currents (WREFI and BREFI). The laser control pin must be enabled for any current to be available at the output. When enabled, the dc component is available whenever bias programming current is applied to RDBIASI, while the pulse component is available at this output only when the pulse date is asserted.

LDRCOMP (Laser Driver Compensation)

This pin is for connection of a compensation network between itself and the output pin in use for the application. This network sets the transient response behavior of the output pulse current.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

Parts List:
10 ASIC (application specific integrated circuit)
12 Output driver circuit
14 Read pulse interface and current switch
16 Write pulse logic interface and current switch
17 Logic portion of 16
18 Boost pulse logic interface and current switch
19 Logic portion of 18
20 Laser
30 Silicon chip
32 Logic switch
36 Laser driver and associated logic circuit
38 HFI circuit and associated logic
40 Logic interface block
41 Bias circuit
42 HFI oscillator transistor

I claim:

1. An integrated laser driver circuit comprising:
   current driver means for providing a single driving current to a laser as a function of driving signals;
   means for providing a first driving signal to said current driver means for causing a driving current to be forwarded to the laser to generate a laser read output;
   means for providing a second driving signal to said current driver means for causing an increased driving current to be forwarded to the laser to generate a laser write output; and
   means for providing a third driving signal to said current driver means for causing a boost in the increased driving current to be forwarded to the laser during a write operation.

2. The integrated laser driver circuit according to claim 1 and further comprising:
   logic means for determining the data level of a WRITE/BOOST signal for not enabling WRITE/BOOST signal or an increase in the output signal above the level of a READ signal if a recording mark is not to be formed by the laser.

3. A method for quickly driving a laser as operating modes are shifted between READ, WRITE, and BOOST modes, comprising the steps of:
   providing an enabling signal whenever a READ or a WRITE operation is to be performed;
   summing a READ signal with a WRITE signal to drive a laser driver current source with an amplified sum signal during the writing of a recording medium;
   adding a BOOST signal with the summed READ and WRITE signals during a portion of the WRITE signal to provide an improved writing of the recording medium when a WRITE data signal is high; and
   deleting the WRITE signal and the BOOST signal from the READ signal when the WRITE data signal is low.

4. A laser driver comprising:
   current driver means responsive to input drive signals for providing a driving current to a laser;
   read pulse current switch means for providing a drive signal to said current driver when enabled;
   write pulse means for providing a WRITE pulse drive signal to said current driver when enabled;
   boost pulse means for providing a BOOST pulse drive signal to said current driver when enabled; and
   means for enabling the read pulse current switch means during a read or write operation, the boost pulse means during a write operation and the write pulse means during a write operation.

5. The laser driver according to claim 4 and further comprising:
   an oscillator means having an output connected to the current driver means for providing an oscillating signal that reduces laser noise.

6. An integrated laser driver chip comprising:
   current driver means for amplifying the level of a summed drive signal to provide a driving current to a laser;
   read pulse switch means for providing a read drive signal when enabled;
   write pulse means for providing a WRITE pulse drive signal when enabled;
   boost pulse means for providing a BOOST pulse drive signal when enabled;
   means for enabling the read pulse current switch means during a read, write or boost operation, the boost pulse means during a write operation and the write pulse means during a write operation; and
   means for summing the provided drive signals to provide the summed drive signal.

7. The integrated laser driver chip according to claim 6 and further comprising:
   means for amplifying the summed drive signal to form the input drive signal that is applied to said current driver means.

8. The integrated laser driver chip according to claim 6 wherein said READ pulse means, said BOOST pulse means, and said WRITE pulse means are current mirrors.

* * * * *